United States Patent
Shim

(10) Patent No.: US 9,362,004 B2
(45) Date of Patent: Jun. 7, 2016

(54) SEMICONDUCTOR DEVICE, SEMICONDUCTOR MEMORY DEVICE AND MEMORY SYSTEM

(71) Applicant: SK hynix Inc., Gyeonggi-do (KR)

(72) Inventor: Young-Bo Shim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/488,012

(22) Filed: Sep. 16, 2014

(65) Prior Publication Data

US 2015/0294736 A1   Oct. 15, 2015

(30) Foreign Application Priority Data

Apr. 15, 2014   (KR) .................. 10-2014-0044812

(51) Int. Cl.

| G11C 17/00 | (2006.01) |
|---|---|
| G11C 29/12 | (2006.01) |
| G11C 7/20 | (2006.01) |
| G11C 29/00 | (2006.01) |
| G11C 7/10 | (2006.01) |
| G11C 17/16 | (2006.01) |
| G11C 17/18 | (2006.01) |

(Continued)

(52) U.S. Cl.
CPC .......... *G11C 29/1201* (2013.01); *G11C 7/1006* (2013.01); *G11C 7/1051* (2013.01); *G11C 7/1072* (2013.01); *G11C 7/1078* (2013.01); *G11C 7/20* (2013.01); *G11C 7/22* (2013.01); *G11C 17/16* (2013.01); *G11C 17/18* (2013.01); *G11C 29/70* (2013.01); *G11C 11/16* (2013.01); *G11C 13/00* (2013.01); *G11C 16/00* (2013.01); *G11C 16/12* (2013.01); *G11C 17/143* (2013.01); *G11C 2029/0407* (2013.01); *G11C 2029/4402* (2013.01)

(58) Field of Classification Search
CPC ...... G11C 17/16; G11C 17/18; G11C 7/1051; G11C 7/1078; G11C 7/22; G11C 7/1006; G11C 7/1072
USPC ....................... 365/96, 189.05, 201
See application file for complete search history.

(56) References Cited

U.S. PATENT DOCUMENTS 6,163,863 A * 12/2000 Schicht .................. G11C 29/40
365/201
6,515,905 B2 * 2/2003 Hikida ............... G11C 16/3468
365/185.11

(Continued)

FOREIGN PATENT DOCUMENTS

KR   1020070082815   8/2007
KR   1020130123933   11/2013

*Primary Examiner* — Pho M Luu
(74) *Attorney, Agent, or Firm* — IP & T Group LLP

(57) ABSTRACT

A semiconductor device includes a nonvolatile memory block suitable for outputting data stored in a plurality of nonvolatile memory cells included therein based on first control information, and programming data in the nonvolatile memory cells based on second control information; a control block suitable for generating the first control information based on an initialization signal, wherein the control block sequentially generates the second control information and the first control information when a program mode is activated; and a test control block suitable for deactivating the nonvolatile memory block and determining whether at least one control signal among a plurality of control signals included in the first and second control information is normally generated, in a test operation on the program mode.

20 Claims, 10 Drawing Sheets

(51) Int. Cl.

| | | |
|---|---|---|
| *G11C 7/22* | (2006.01) | |
| *G11C 11/16* | (2006.01) | |
| *G11C 13/00* | (2006.01) | |
| *G11C 16/00* | (2006.01) | |
| *G11C 16/12* | (2006.01) | |
| *G11C 17/14* | (2006.01) | |
| *G11C 29/04* | (2006.01) | |
| *G11C 29/44* | (2006.01) | |

(56) References Cited

U.S. PATENT DOCUMENTS 6,580,644 B1 * 6/2003 Chung ............... G11C 16/30
                                                              365/185.09
7,212,456 B2 * 5/2007 Callaway ............ G11C 29/006
                                                              365/189.07
8,913,451 B2 * 12/2014 Yoon ................... G11C 29/40
                                                              365/189.04

\* cited by examiner

SEMICONDUCTOR DEVICE, SEMICONDUCTOR MEMORY DEVICE AND MEMORY SYSTEM

CROSS-REFERENCE TO RELATED APPLICATIONS

The present application claims priority of Korean Patent Application No. 10-2014-0044812, filed on Apr. 15, 2014, which is incorporated herein by reference in its entirety.

BACKGROUND

1. Field

Various embodiments of the present invention relate to a semiconductor device, a semiconductor memory device, and a memory system.

2. Description of the Related Art

Fuses are used for various semiconductor devices, for example, a semiconductor memory device. A laser fuse may output a signal or data, having a logic value that varies according to whether or not the laser fuse is cut. An E-fuse may output a signal having a logic value that varies according to whether or not a gate oxide of a transistor forming E-fuse is ruptured.

A semiconductor memory device utilizes a redundancy scheme in which a normal cell with a fail (hereinafter, referred to as a failed cell) is replaced with a redundancy cell to improve the manufacturing yield. If a failed cell is detected in a test procedure after a wafer process is completed, the failed cell should be replaced with a redundancy cell. Therefore, the address of the failed cell needs to be stored. To store the address of the failed cell, a laser fuse or an E-fuse is generally used. If the laser fuse and the E-fuse are programmed once, the logic value of data may not be changed. For example, after a laser fuse is cut, it may be impossible to recover the laser fuse to an original state, and, after an E-fuse is ruptured, it may be impossible to recover the E-fuse to an original state. Thus, a memory cell, which may not be recovered to its original state after data is programmed once, is referred to as a one-time program cell.

FIG. 1 is a block diagram illustrating a conventional semiconductor memory device.

Referring to FIG. 1, the semiconductor memory device includes a memory cell array 110 having a plurality of memory cells, a row circuit 120 for activating a word line selected by a row address R_ADD, and a column circuit 130 for accessing, that is, reading or writing, the data of a bit line selected by a column address C_ADD.

A row fuse circuit 140 stores a row address corresponding to a failed memory cell in the memory cell array 110, as a repair row address REPAIR_R_ADD, A row comparison block 150 compares the repair row address REPAIR_R_ADD stored in the row fuse circuit 140 and the row address R_ADD inputted from the exterior of the semiconductor memory device. When the repair row address REPAIR_R_ADD coincides with the row address R_ADD, the row comparison block 150 controls the row circuit 120 to activate a redundancy word line in place of a word line designated by the row address R_ADD. That is, a row, such as a normal word line, corresponding to the repair row address REPAIR_R_ADD stored in the row fuse circuit 140 is replaced with a redundancy row such as, a redundancy word line.

The reference symbol ACT denotes an active command, PRE a precharge command, RD a read command, and WT a write command.

The row fuse circuit 140 generally uses laser fuses. Although the programming of the laser fuses may be possible only in a wafer state, it may be impossible to program the laser fuses after the semiconductor memory device is packaged. Therefore, in the case of using laser fuses, a failed cell may not be repaired after the semiconductor memory device is packaged.

To overcome such a disadvantage, an E-fuse is used. The E-fuse is formed as a transistor, and is a fuse which stores data by changing the resistance between a gate and a drain/source.

FIG. 2 is a block diagram illustrating a conventional semiconductor memory device having a nonvolatile memory for storing repair data.

Referring to FIG. 2, it may be seen that the row fuse circuit 140 is removed from the semiconductor memory device shown in FIG. 1 and a nonvolatile memory 210 and a latch block 220 are added.

The nonvolatile memory 210 and a latch block 220 replace the row fuse circuit 140. A row address corresponding to a failed memory cell in the memory cell array 110 is stored in the nonvolatile memory 210, as a repair row address. The nonvolatile memory 210 may be any one of nonvolatile memories such as an E-fuse array circuit, a NAND flash memory, a NOR flash memory, a magnetic random access memory (MRAM), a spin torque transfer magnetic random access memory (STT-MRAM), a resistive random access memory (ReRAM) and a phase change random access memory (PCRAM).

The latch block 220 receives and stores repair data REPAIR_DATA, such as, a fail address, stored in the nonvolatile memory 210. The repair data REPAIR_DATA stored in the latch block 220 is used in a redundancy operation. The latch block 220 includes latch circuits, and may store the repair data REPAIR_DATA only while power is supplied. An operation, in which the repair data REPAIR_DATA is transmitted from the nonvolatile memory 210 to the latch block 220 and is stored in the latch block 220, is referred to as a boot-up operation.

The repair data REPAIR_DATA stored in the nonvolatile memory 210 is not directly used and is transmitted to and stored in the latch block 210 since when the nonvolatile memory 210 is formed in an array type, a predetermined time is required to call the data stored in the nonvolatile memory 210. Since the immediate call of data may be impossible, a redundancy operation may not be performed by directly using the data stored in the nonvolatile memory 210. Therefore, a boot-up operation, in which the repair data stored in the nonvolatile memory 210 is transmitted to and stored in the latch block 200 is performed, and a redundancy operation is performed using the data stored in the latch block 220, after the boot-up operation is performed.

As the row fuse circuit 140 formed of laser fuses is replaced with the nonvolatile memory 210 and the latch block 220, an additional fail which occurs after a wafer state, may be repaired. Research has been made for a technology capable of repairing a fail occurring after the fabrication of a semiconductor memory device, by accessing the nonvolatile memory 210 even after the fabrication of the semiconductor memory device, for example, after the sale of a product.

SUMMARY

Various embodiments are directed to a semiconductor device that may test whether a circuit for storing repair data in a nonvolatile memory operates normally, without directly programming the repair data in the nonvolatile memory block, and a semiconductor memory device and a memory system.

Furthermore, various embodiments of the present invention are directed to a semiconductor device, a semiconductor memory device and a memory system, that may simply perform a test of a circuit for storing repair data in a nonvolatile memory block.

In an embodiment of the present invention, a semiconductor device may include: a nonvolatile memory block suitable for outputting data stored in a plurality of nonvolatile memory cells included therein based on first control information, and programming data in the nonvolatile memory cells based on second control information; a control block suitable for generating the first control information based on an initialization signal, wherein the control block sequentially generates the second control information and the first control information when a program mode is activated; and a test control block suitable for deactivating the nonvolatile memory block and determining whether at least one control signal among a plurality of control signals included in the first and second control information is normally generated during a test operation on the program mode, In an embodiment of the present invention, a semiconductor memory device may include: a nonvolatile memory suitable for storing repair data, transmitting the stored repair data in an initialization operation, wherein, when a program mode is activated, the nonvolatile memory stores inputted repair data by using control information generated therein and transmits the stored repair data; a test control block suitable for controlling the nonvolatile memory, and determining whether the control information is normally generated, in a test operation on the program mode, wherein the nonvolatile memory generates the control information but does not perform operations of storing and transmitting the repair data; a latch block suitable for storing data transmitted from the nonvolatile memory, when the initializing operation is performed or when the program mode is activated; and a memory cell array in which normal cells are replaced with redundancy cells by using the data stored in the latch block.

In an embodiment of the present invention, a memory system may include: a memory device including a nonvolatile memory and a memory cell array, which performs a redundancy operation for replacing normal cells therein with redundancy cells therein, by using repair data stored in the nonvolatile memory, wherein the memory device outputs first data indicating whether an unused storage space exists in the nonvolatile memory in an initializing operation, stores inputted repair data in the nonvolatile memory when a program mode is activated, and outputs second data indicating that an internal control signal generated for performing the program mode is normally generated in a test operation during the program mode; and a memory controller, based on the first data and the second data outputted from the memory device, suitable for storing new repair data in the nonvolatile memory through the program mode when an unused storage space exists in the nonvolatile memory, wherein the memory controller deactivates the program mode when an unused storage space does not exist in the nonvolatile memory or when the internal control signal is not normally generally.

DETAILED DESCRIPTION

Figure 1:
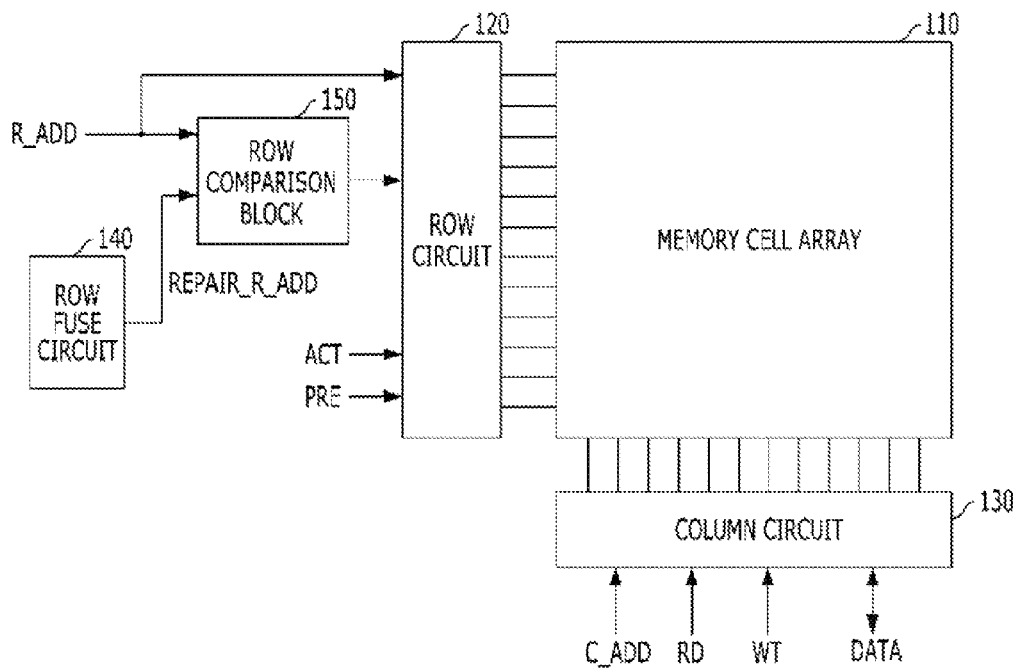
FIG. 1 is a block diagram illustrating a conventional semiconductor memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the drawings, a thicknesses and length of components are exaggerated compared to actual physical thickness and intervals for convenience of illustration. In the following description, a detailed explanation of known related functions and constitutions may be omitted to avoid unnecessarily obscuring the subject manner of the present invention. Furthermore, 'connected/coupled' represents that one component is directly coupled to another component or indirectly coupled through another component. In this specification, a singular form may include a plural form as long as it is not specifically mentioned in a sentence. Furthermore, "include/comprise" or "including/comprising" used in the specification represents that one or more components, steps, operations and elements exist or are added.

In the following descriptions, a boot-up operation may denote an operation of outputting and transmitting the data stored in a nonvolatile memory block, and a program operation may denote an operation of programming new data in the nonvolatile memory.

Figure 2:
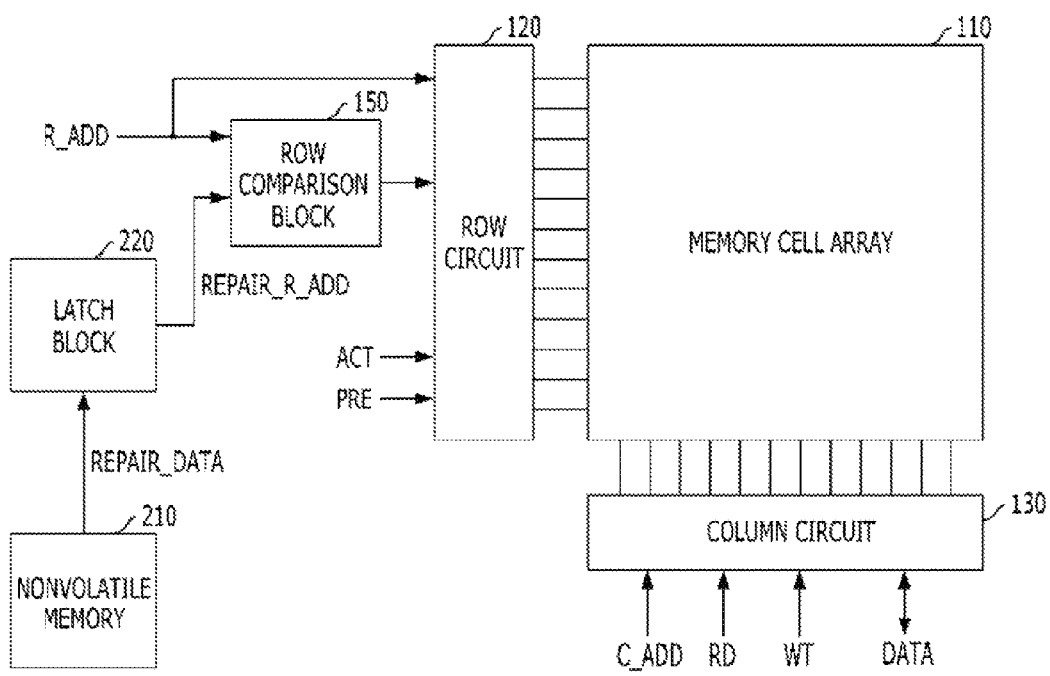
FIG. 2 is a block diagram illustrating a conventional semiconductor memory device having a nonvolatile memory for storing repair data.
Figure 3:
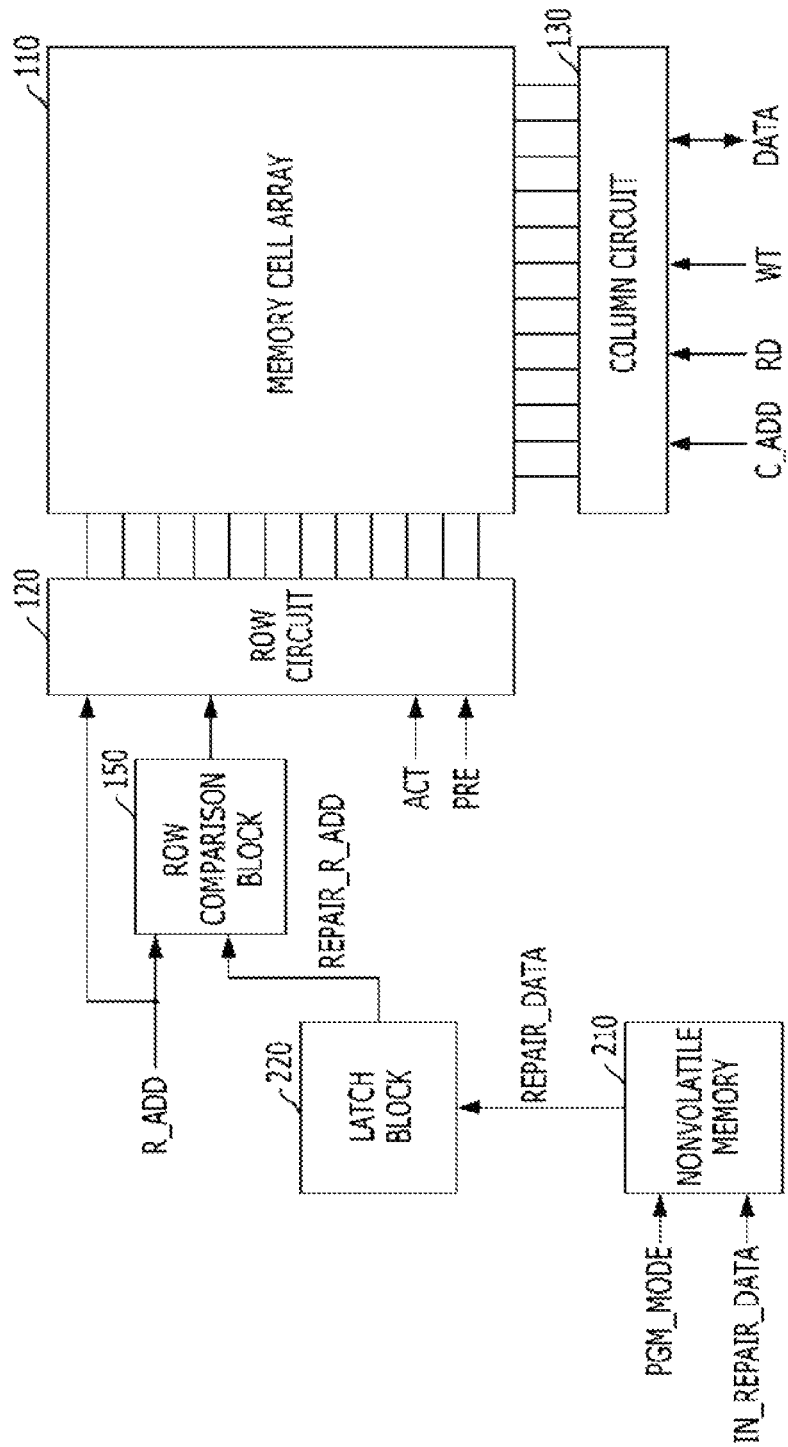
FIG. 3 is a block diagram for describing an operation of storing repair data in a nonvolatile memory included in a semiconductor memory device.

FIG. 3 is a block diagram for describing an operation of storing repair data in a nonvolatile memory included in a semiconductor memory device. Referring to FIG. 3, the semiconductor memory device may be included in a semiconductor memory package that is completely packaged The configuration and operations of the semiconductor memory device shown in FIG. 3 are the same as the configuration and operations of the semiconductor memory device shown in FIG. 2, except that the nonvolatile memory 210 stores input repair data IN_REPAIR_DATA when a program mode signal PGM_MODE is activated.

Although the internal configuration of the nonvolatile memory 210 is not shown, the nonvolatile memory 210 may include a plurality of nonvolatile memory cells and a control circuit (not shown) for accessing the nonvolatile memory cells, that is, programming or booting up. The control circuit may generate various control signals, including control voltages, used for a program operation or a boot-up operation. When the control circuit does not operate normally, the nonvolatile memory 210 may not store or abnormally store the input repair data IN_REPAIR_DATA, which may cause an operation error in the semiconductor memory device. Therefore, it is needed to test whether the control circuit operates normally.

To test, a method of storing new repair data in the nonvolatile memory 210, transmitting the new repair data to the latch block 220 and checking whether the semiconductor memory device normally performs a redundancy operation may be employed. However, such a method is complex in its processes. When each nonvolatile memory cell is a one-time program cell such as an E-fuse, concerns may arise in that the nonvolatile memory cell used for a test is consumed.

Figure 4:
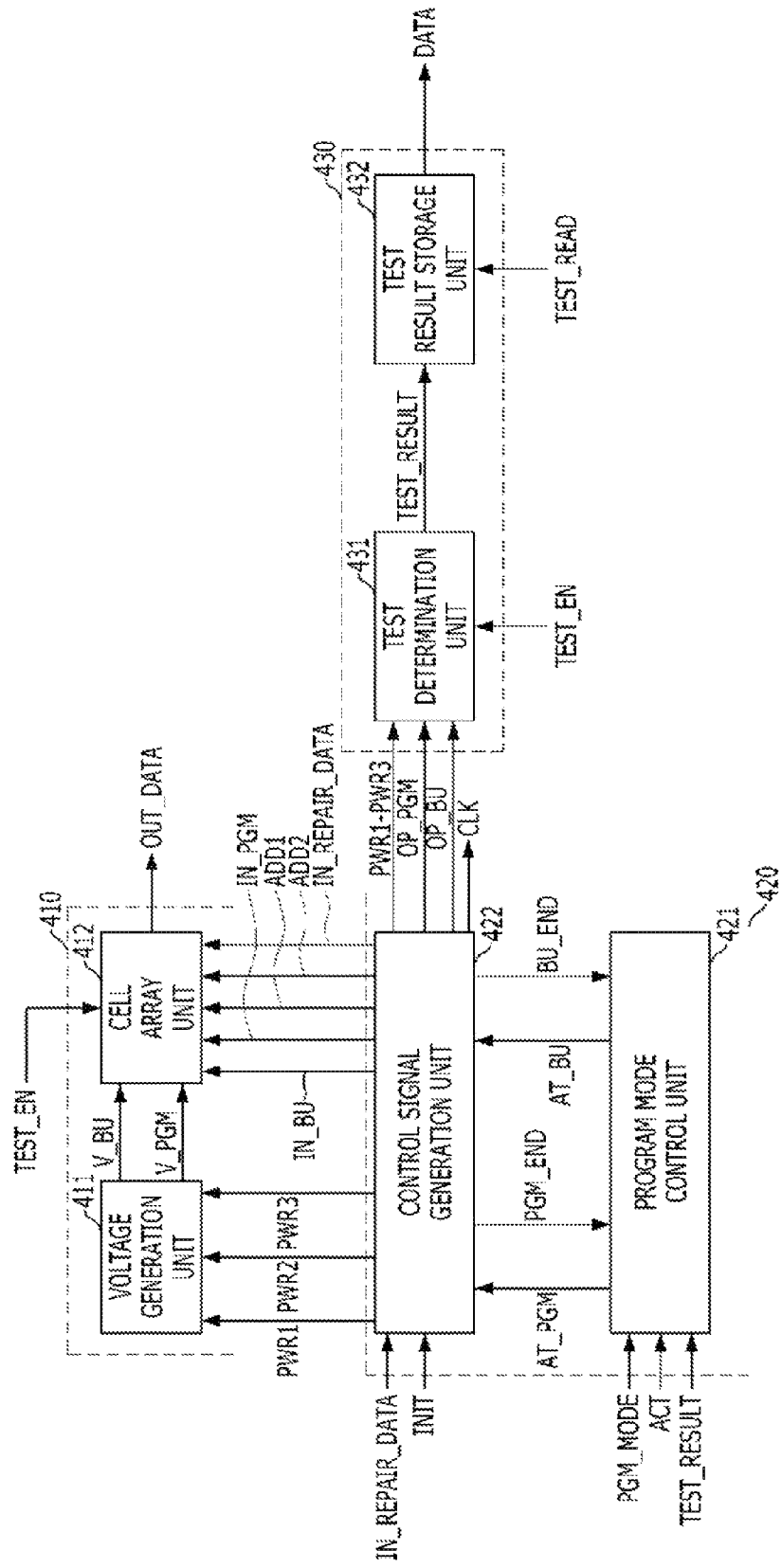
FIG. 4 is a block diagram illustrating a semiconductor device in accordance with an embodiment of the present invention.

FIG. 4 is a block diagram illustrating a semiconductor device in accordance with an embodiment of the present invention.

As shown in FIG. 4, the semiconductor device may include a nonvolatile memory block 410, a control block 420, and a test control block 430.

Operations of the semiconductor device will be described below with reference to FIG. 4.

The nonvolatile memory block 410 may include a plurality of nonvolatile memory cells (not shown in FIG. 4), and may output the data stored in the nonvolatile memory cells or store input repair data IN_REPAIR_DATA in the nonvolatile memory cells. The nonvolatile memory block 410 may include a voltage generation unit 411 and a cell array unit 412.

The voltage generation unit 411 generates a boot-up voltage V_BU used for a boot-up operation and transfers the boot-up voltage V_BU to the cell array unit 412, when a first power signal PWR1 is activated. The voltage generation unit 411 generates a program voltage V_PGM used for a program operation, when a second power signal PWR2 is activated, and transfers the program voltage V_PGM to the cell array unit 412 when a third power signal PWR3 is activated.

The cell array unit 412 includes the nonvolatile memory cells and outputs the data stored in the nonvolatile memory cells as output data OUT_DATA, by using the boot-up voltage V_BU, when an internal boot-up signal IN_BU is activated. Additionally, the cell array unit 412 programs the nonvolatile memory cells according to the input repair data IN_REPAIR_DATA, by using the program voltage V_PGM, when an internal program signal IN_PGM is activated. Each nonvolatile memory cell may be any one of nonvolatile memory cells such as an E-fuse, a flash memory cell, an MRAM memory cell, an STT-MRAM memory cell and a PCRAM memory cell. In particular, each nonvolatile memory cell may be a one-time program cell capable of having the logic value of the data stored therein being changed once.

The cell array unit 412 is deactivated based on a test signal TEST_EN which is activated when performing the test during a program mode. When deactivated, the cell array unit 412 does not output the data of the nonvolatile memory cells or does not program the nonvolatile memory cells, even though the internal boot-up signal IN_BU or the internal program signal IN_PGM is activated.

The control block 420 generates a plurality of control signals PWR1 to PWR3, AT_BU, OP_BU, IN_BU AT_PGM, OP_PGM, IN_PGM, ADD1 ADD2, CLK PGM_END and BU_END used for controlling the nonvolatile memory block 410. The control block 420 may include a program mode control unit 421 and a control signal generation unit 422.

The program mode is entered when a program mode signal PGM_MODE is activated, and is activated when an active command ACT is activated when the program mode is entered. The program mode control unit 421 activates the program signal AT_PGM to program the input repair data IN_REPAIR_DATA in the nonvolatile memory block 410, when the program mode is activated, and deactivates the program signal AT_PGM when program is completed, that is, when the program end signal PGM_END is activated. If a predetermined time passes after program is completed, the program mode control unit 421 activates the boot-up signal AT_BU to output the data of the nonvolatile memory block 410, and deactivates the boot-up signal AT_BU when boot-up is completed, that is, when the signal BU_END is activated.

The program mode control unit 421 receives a test result TEST_RESULT of the program mode, and does not activate the program mode when controls signals for the program mode are not normally generated. That is, the program mode control unit 421 does not activate the program signal AT_PGM and the boot-up signal AT_BU.

The control signal generation unit 422 activates the boot-up operation signal OP_BU when an initialization signal INIT or the boot-up signal AT_BU is activated, and activates the internal boot-up signal IN_BU with a predetermined cycle during a period in which the boot-up operation signal OP_BU is activated. The boot-up operation signal OP_BU is activated during a boot-up operation period. Further, the control signal generation unit 422 activates the program operation signal OP_PGM based on the program signal AT_PGM, and activates the internal program signal IN_PGM during a period in which the program operation signal OP_PGM is activated. The program operation signal OP_PGM is activated during a program operation period.

The control signal generation unit 422 may generate the first address ADD1 and the second address ADD2 in the boot-up operation or the program operation. The first and second addresses ADD1 and ADD2 are addresses for selecting a row and a column, respectively, in the cell array unit 412. The first and second addresses ADD1 and ADD2 may be multi-bit digital signals. At least one address of the first and second addresses ADD1 and ADD2 may be an address which is inputted from the exterior. The clock CLK may be outputted together with the data of the cell array unit 412 in the boot-up operation.

For reference, first control information may include at least one signal of the first power signal PWR1, the boot-up signal AT_BU, the boot-up operation signal OP_BU, and the internal boot-up signal IN_BU. Second control information may include at least one signal of the second and third power signals PWR2 and PWR3, the program signal AT_PGM, the program operation signal OP_PGM, and the internal program signal IN_PGM. Moreover, the first control information may include control signals used for performing the boot-up operation, in addition to the above-described signals, and the second control information may include control signals used for performing the program operation, in addition to the above-described signals. The initialization signal INIT may be activated when the semiconductor device is powered on, in a power-off state or is reset.

The test control block 430 performs a test for whether the program mode is normally performed. The test control block 430 may include a test determination unit 431 and a test result storage unit 432.

The test determination unit 431 receives at least one control signal among the control signals included in the first control information and the second control information, when testing the program mode, that is, when the test signal TEST_EN is activated, and determines whether the inputted control signal is normally activated. For example, the at least one control signal inputted to the test determination unit 431 may include all or a part of the first to third power signals PWR1 to PWR3, the boot-up signal AT_BU, the program signal AT_PGM, the boot-up operation signal OP_BU, the program operation signal OP_PGM, the internal boot-up signal IN_BU, and the internal program signal IN_PGM. In FIG. 4 the at least one control signal inputted to the test determination unit 431 is the first to third power signals PWR1 to PWR3, the boot-up operation signal OP_BU and the program operation signal OP_PGM.

If the test signal TEST_EN is activated, the test determination unit 431 may latch the logic values of the second power signal PWR2, the third power signal PWR3 and the program operation signal OP_PGM when performing the program operation with the program mode activated, and may latch the logic values of the first power signal PWR1 and the boot-up operation signal OP_BU when performing the boot-up operation. Thereafter, if the boot-up operation is completed, the test determination unit 431 may determine whether the control signals are normally activated, by combining the latched values, and may generate the test result TEST_RESULT according to a determination result. For example, when all control signals are normally activated (that is, when the program mode operates normally, the test determination unit 431 deactivates the test result TEST_RESULT. Conversely, when at least one control signal is not normally activated that is, when the program mode does not operate normally, the test determination unit 431 activates the test result TEST_RESULT.

Furthermore, signals which are used by the test determination unit 431 for a test may not necessarily be the same as those used in the examples described above, and according to a design, may include at least one signal among the signals generated when the program mode is activated.

The test result storage unit 432 stores the test result TEST_RESULT when a test operation is completed. The test result storage unit 432 may output a stored value as data DATA when a test result read command TEST_READ is activated.

Operations of the semiconductor device will be described below.

During initializing operation for the semiconductor device such as, power-on from a power-off state or resetting, if the initialization signal INIT is activated, the boot-up operation signal OP_BU is activated, the internal boot-up signal IN_BU is cyclically activated during the period in which the boot-up operation signal OP_BU is activated, and the first and second addresses ADD1 and ADD2 are generated. The value of at least one address of the first and second addresses ADD1 and ADD2 may be sequentially changed. For example, when outputting one row data each time the internal boot-up signal IN_BU is activated once, the value of the first address ADD1 may be sequentially changed in such a way as to change each time the internal boot-up signal IN_BU is activated, starting from a value corresponding to a first row up to a value corresponding to a final row. Thus, the data of the first row to the data of the final row may be sequentially outputted as the output data OUT_DATA. The boot-up voltage V_BU is used to read the data of the nonvolatile memory cells.

When the program mode of the semiconductor device is activated, the program signal AT_PGM is activated first, and then, the boot-up signal AT_BU is activated. If the program signal AT_PGM is activated, the program operation signal OP_PGM is activated, the internal program signal IN_PGM is cyclically activated during the period in which the program operation signal OP_PGM is activated, and the first and second addresses ADD1 and ADD2 are generated. The input repair data IN_REPAIR_DATA are programmed in the nonvolatile memory cells which are designated by the first and second addresses ADD1 and ADD2, by using the program voltage V_PGM. When the program operation is completed, the program end signal PGM_END is activated.

When a predetermined time passes after the program end signal PGM_END is activated, the boot-up signal AT_BU is activated. An operation after the boot-up signal AT_BU is activated is the same as the boot-up operation described in the initialization operation above. If the boot-up operation is completed, the signal BU_END is activated.

To test the program mode of the semiconductor device, when the program mode is activated with the test signal TEST_EN activated, respective signals operate as in the program mode described above. However, the actual program of the nonvolatile memory cells and the actual data output of the nonvolatile memory cells are not performed.

The test control block 430 latches the second and third power signals PWR2 and PWR3 and the program operation signal OP_PGM in the program operation, latches the first power signal PWR1 and the boot-up operation signal OP_BU in the boot-up operation, and determines and stores whether the signals PWR1 to PWR3, OP_BU and OP_PGM are normally activated, by using latched values.

Although it was described in the above test operation during the program mode that the test signal TEST_EN is inputted to the nonvolatile memory block 410 and deactivates the nonvolatile memory block 410, it is to be noted that control may be made according to a design in such a manner that the test signal TEST_EN is inputted to the control signal generation unit 422 and deactivates a part of the signals for controlling the program mode thereby causing the nonvolatile memory block 410 to not perform the program operation. For example, when the test signal TEST_EN is inputted to the control signal generation unit 422, the control signal generation unit 422 may activate all the above-described control signals in the test operation on the program mode when test signal TEST_EN is activated in the same manner as in the program operation, but may deactivate the internal program signal IN_PGM such that actual program does not occur. That is, various methods may be used, which respective control signals are activated in the test operation but the actual program does not occur.

The semiconductor device according to the embodiment of the present invention determines whether respective control signals are normally activated or deactivated in the program mode, and thereby tests whether circuits for controlling the program mode normally operate. Since a test result may be easily checked by reading the data stored in the test result storage unit 432, a test may be performed in a simpler manner than the conventional art. Furthermore, when the nonvolatile memory cells are one-time program cells, it may not be necessary to consume the nonvolatile memory cells for a test.

Figure 5:
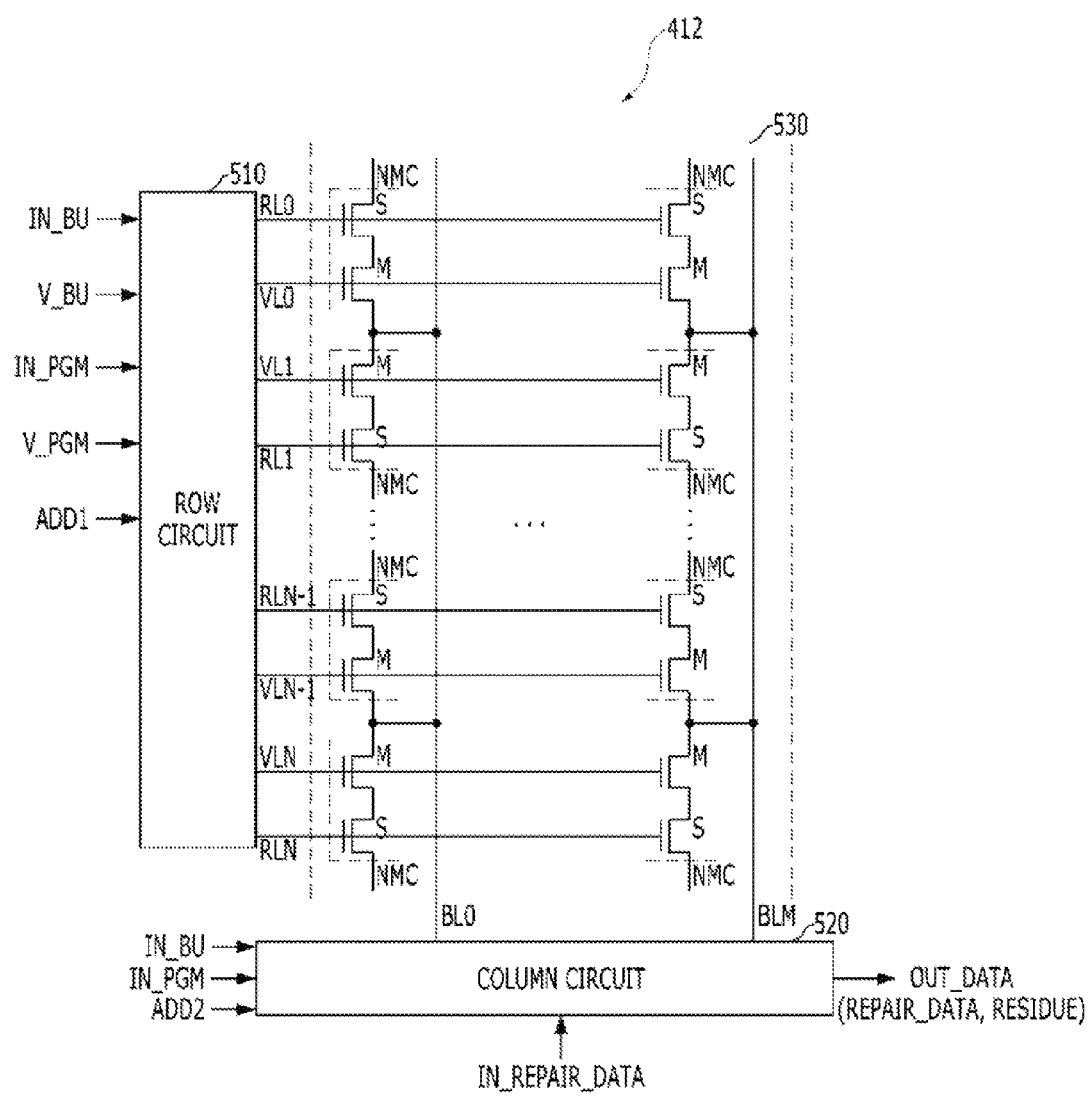
FIG. 5 is a detailed diagram of a cell array unit shown in FIG. 4.

FIG. 5 is a detailed diagram of the cell array unit 412 shown in FIG. 4.

As shown in FIG. 5, the cell array unit 412 may include a row circuit 510, a column circuit 520, and a cell array 530. FIG. 5 shows that each nonvolatile memory cell NMC is an E-fuse.

The cell array unit 412 will be described below with reference to FIGS. 4 and 5.

The cell array 530 may include a plurality of row lines RL0 to RLN, a plurality of voltage lines VL0 to VLN, a plurality of bit lines BL0 to BLM, and a plurality of nonvolatile memory cells NMC. Each nonvolatile memory cell NMC may include a selection transistor S which is turned on or off in response to the voltage of a corresponding row line, and a memory transistor M which is programmed or outputs data according to the voltage of a corresponding voltage line.

The row circuit 510 activates a row line corresponding to the first address ADD1 and applies the boot-up voltage V_BU to the voltage line corresponding to the first address ADD1, when the internal boot-up signal IN_BU is activated. Additionally, the row circuit 510 activates the row line corresponding to the first address ADD1 and applies the program voltage V_PGM to the voltage line corresponding to the first address ADD1, when the internal program signal IN_PGM is activated. In general, the program voltage V_PGM has a voltage level that is higher than the boot-up voltage V_BU and is capable of rupturing the gate oxide of the memory transistor M. The row circuit 510 does not perform the activating operation of a row line and the operation of applying a voltage to a voltage line, when the test signal TEST_EN is activated.

The column circuit 520 reads the data of a bit line corresponding to the second address ADD2, when the internal boot-up signal IN_BU is activated. Moreover, the column circuit 520 drives the bit line corresponding to the second address ADD2, with a voltage determined according to the value of data to program, when the internal program signal IN_PGM is activated. However, the column circuit 520 does not perform the read operation on the data of a bit line and the driving operation of a bit line, when the test signal TEST_EN is activated.

The program operation on the cell array unit 412 is as follows, When the internal program signal IN_PGM is activated, a row line, for example, RL0, corresponding to the first address ADD1 is activated so that the transistor S connected to the row line RL0 is turned on, and the program voltage V_PGM is applied to a voltage line, for example, VL0, corresponding to the first address ADD1. A voltage applied to a bit line, for example, BL0, corresponding to the second address ADD2 varies depending on whether a selected nonvolatile memory cell NMC is programmed or not. A low voltage, for example, a ground voltage, is applied to the bit line BL0 when a selected nonvolatile memory cell NMC is programmed, that is, when storing program data, and a high voltage is applied to the bit line BL0 when the selected nonvolatile memory cell NMC is not programmed, that is, when storing non-program data. The gate oxide of the memory transistor M is ruptured when storing program data and is not ruptured when storing non-program data. The value of program data may be high or low, and the value of non-program data may be opposite to the value of the program data. The remaining bit lines BL1 to BLM are floated.

The boot-up operation on the cell array unit 412 is as follows. When the internal boot-up signal IN_BU is activated, a row line, for example, RL0, corresponding to the first address ADD1 is activated, and the boot-up voltage V_BU is applied to a voltage line, for example, VL0, corresponding to the first address ADD1. A voltage having a voltage level different from the boot-up voltage V_BU is applied to a bit line, for example, BL0, corresponding to the second address ADD2. If current flows through a selected bit line, the data stored in the nonvolatile memory cell NMC is program data, otherwise the data stored in the nonvolatile memory cell NMC is non-program data. Read data is outputted to an exterior of the semiconductor device, and the output data OUT_DATA may include repair data REPAIR_DATA. and data RESIDUE which indicate whether or not there is an unused, that is, available, storage space in the nonvolatile memory block 410.

Figure 6:
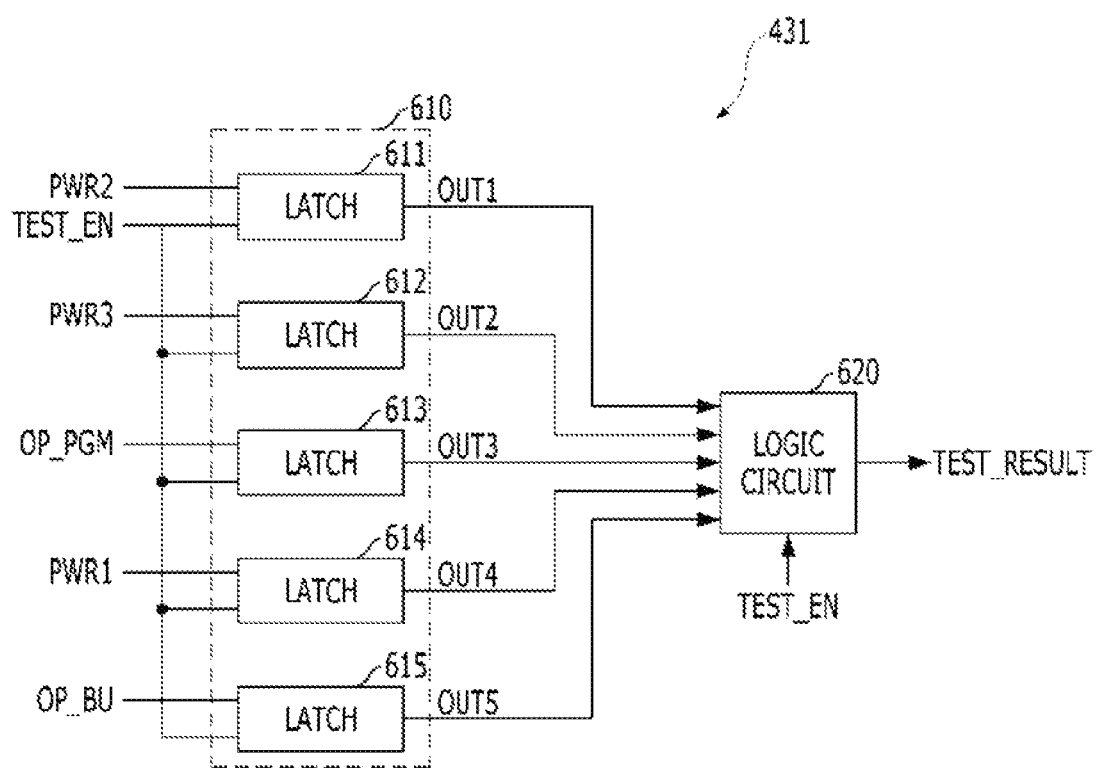
FIG. 6 is a detailed diagram of a test determination unit shown in FIG. 4.

FIG. 6 is a block diagram of the test determination unit 431 shown in FIG. 4.

As shown in FIG. 6, the test determination unit 431 may include an input signal latch section 610 and a logic circuit 620.

The input signal latch section 610 includes a plurality of latches 611 to 615. Each of the latches 611 to 615 may correspond to one signal among the signals PWR1 to PWR3 OP_BU and OP_PGM which are inputted to the test determination unit 431, and may latch the corresponding signal when the test signal TEST_EN is activated. Each of the latches 611 to 615 is inputted with, latches and outputs the corresponding signal when the test signal TEST_EN is activated. Accordingly, the latches 611 to 615 activate their outputs OUT1 to OUT5 when corresponding signals are normally activated during a period in which the test signal TEST_EN is activated, otherwise deactivate their outputs OUT1 to OUT5. For example, if a corresponding signal is normally activated at least one time while the test signal TEST_EN is activated, the latches 611 may latch a value corresponding to an activated state and may activate its output OUT1.

When the test signal TEST_EN is activated, the logic circuit 620 receives the outputs OUT1 to OUT5 of the respective latches 611 to 615, combines the outputs OUT1 to OUT5 and determines whether control signals are normally activated in the program mode, and activates or deactivates the test result TEST_RESULT according to a determination result. For example, the logic circuit 520 deactivates the test result TEST_RESULT when the outputs OUT1 to OUT5 of the latches 611 to 615 are activated, otherwise the logic circuit activates the test result TEST_RESULT.

Figure 7:
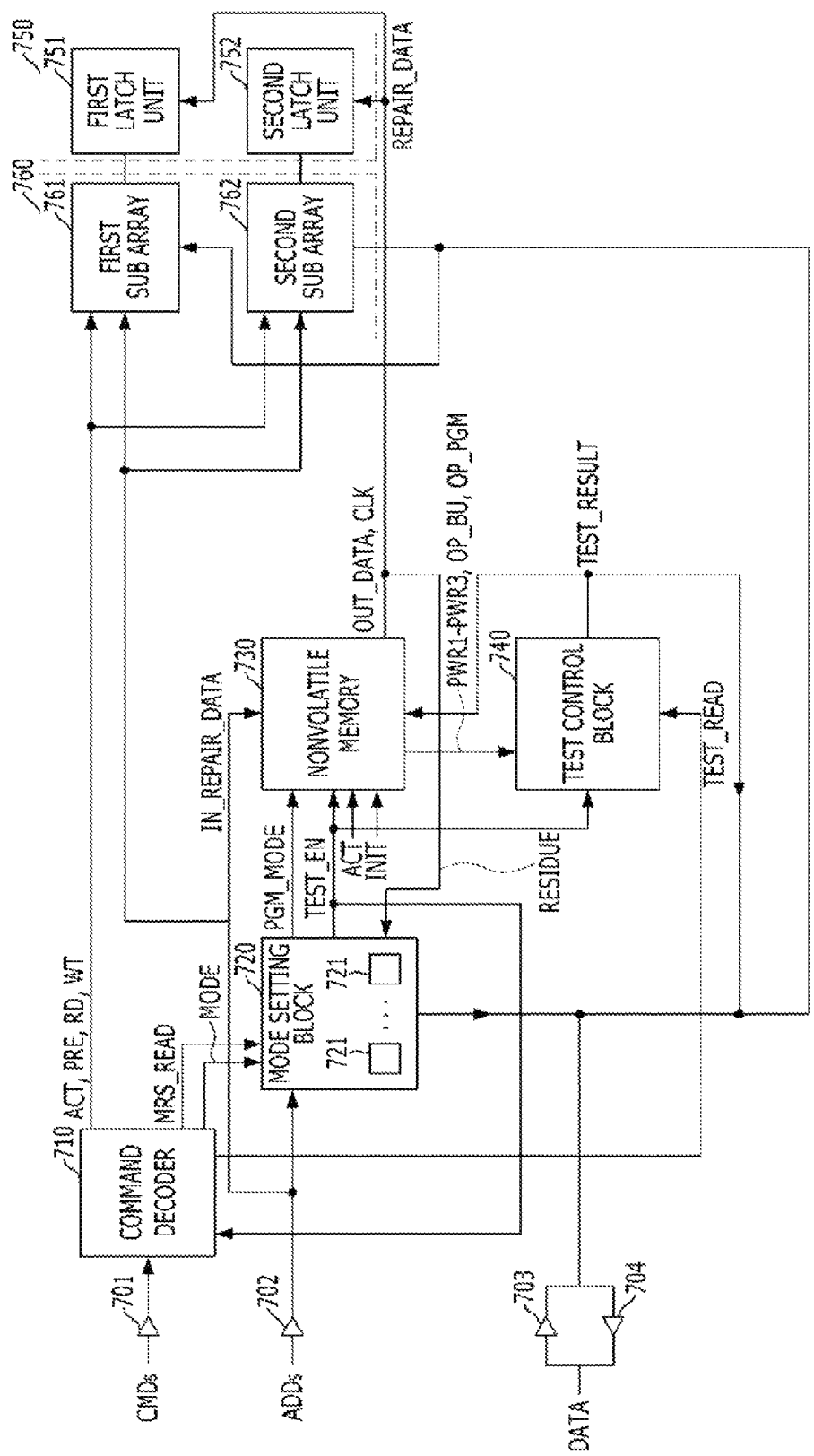
FIG. 7 is a block diagram illustrating a semiconductor memory device in accordance with an embodiment of the present invention.

FIG. 7 is a block diagram illustrating a semiconductor memory device in accordance with an embodiment of the present invention.

As shown in FIG. 7, the semiconductor memory device may include a command input block 701 an address input block 702, a data input block 703, a data output block 704, a command decoder 710, a mode setting block 720, a nonvolatile memory 730, a test control block 740, a latch block 750, and a memory cell array 760.

The semiconductor memory device will be described below with reference to FIGS. 4 to 7.

The memory cell array 760 may include a first sub cell array 761 and a second sub cell array 762 each of which includes a plurality of memory cells including normal cells and redundancy cells (not shown). The first sub cell array 761 and the second sub cell array 762 may be configurations that include memory banks. The first sub cell array 761 may perform a redundancy operation by using the repair data stored in a first latch unit 751, and the second sub cell array 762 may perform a redundancy operation by using the repair data stored in a second latch unit 752. The memory cell array 760 may read or write the data of memory cells, which are designated by addresses ADDs, in response to commands ACT, RD and WT.

The command input block 701 receives command signals CMDs which are inputted from an exterior of the semiconductor memory devices. The address input block 702 receives the addresses ADDs having multiple bits inputted from an exterior of the semiconductor memory device. The addresses ADDS may include a row address, a column address, and a bank address. The data input block 703 receives multi-bit data, which are inputted from an exterior of the semiconductor memory device, and the data output block 704 outputs data to an exterior of the semiconductor memory device. For example, data to be stored in the semiconductor memory device are inputted through the data input block 703, and data to be outputted from the semiconductor memory device are outputted through the data output block 704.

The command decoder 710 decodes the command signals CMDs which are inputted through the command input block 701 and generates command signals. These command signals may include an active command ACT, a precharge command PRE, a read command RD, a write command WT, a mode setting command MODE, a mode register read command MRS_READ, a test result read command TEST_READ, and so forth. The command decoder 710 may activate the mode register read command MRS_READ instead of the read command RD, when a combination of command signals corresponding to the read command RD is inputted while the mode setting command MODE is activated, and may activate the test result read command TEST_READ instead of the read command RD, when a combination of command signals corresponding to the read command RD is inputted while the test signal TEST_EN is activated.

The mode setting block 720 combines a part of the address signals ADDs inputted through the address input block 702 when the mode setting command MODE is activated and thereby performs various setting operations and a mode entry operation of the semiconductor memory device, and through these operations, a program mode, which is also referred to as a post package repair mode since repair is performed after the fabrication of the semiconductor memory device, may be entered. If entry to the program mode is made, the mode setting block 720 may activate a program mode signal PGM_MODE. If entry to a test mode is made, the mode setting block 720 may activate the test signal TEST_EN.

The mode setting block 720 may include a plurality of mode registers 721 for storing information for mode setting and the results of operations by mode setting. The data stored in the mode registers sets 721 may be outputted to an exterior of the semiconductor memory device through the data output block 704 when the mode register read command MRS_READ is activated. The mode registers 721 may store the data RESIDUE described above.

The nonvolatile memory 730 may have a configuration which includes the nonvolatile memory block 410 and the control block 420 of the semiconductor device shown in FIG. 4. The nonvolatile memory 730 may transmit the data stored therein, to the latch block 750 through a boot-up operation, in an initializing operation when the initialization signal INIT is activated and the clock CLK may be transmitted together. The output data OUT_DATA outputted from the nonvolatile memory 730 may include, as repair data, the addresses REPAIR_DATA of normal cells, which have failed, among the memory cells included in the memory cell array 760. Further, the output data OUT_DATA may include the data RESIDUE.

If the memory cell array 760 includes at least two sub cell arrays 761 and 762, the storage space of the nonvolatile memory 730 may be divided into storage spaces, which correspond to the respective sub cell arrays, and in the boot-up operation, the nonvolatile memory 730 may output whether or not there are unused or available storage spaces in the storage spaces, as the data RESIDUE. For example, when the memory cell array 760 includes the first and second sub cell arrays 761 and 762, the storage space of the nonvolatile memory 730 is divided into two storage spaces, hereinafter, referred to as a first storage space and a second storage space, which correspond to the first and second sub cell arrays 761 and 762, respectively. In the boot-up operation, the data RESIDUE may include information on whether an unused storage space exists in the first storage space and whether an unused storage space exist the second storage space.

The nonvolatile memory 730 may store the input repair data IN_REPAIR_DATA when the active command ACT is activated, that is, when the program mode is activated, after the program mode is entered, and may transmit the data stored therein to the latch block 750 as the repair data RE-PAIR_DATA, through the boot-up operation. The input repair data IN_REPAIR_DATA may be a part of the signals inputted through the address input block 702 or the data input block in 703. FIG. 7 shows that the input repair data IN_REPAIR_DATA are a part of the signals ADDs inputted through the address input block 702.

When performing a test operation for the program mode, that is, when the test signal TEST_EN is activated, the nonvolatile memory 730 internally activates control signals PWR1 to PWR3, AT_BU, OP_BU, IN_BU, AT_PGM, OP_PGM, IN_PGM, ADD1, ADD2, CLK, PGM_END and BU_END, in the same manner as in performing the program operation and the boot-up operation, but does not actually program nonvolatile memory cells or does not actually output the data of nonvolatile memory cells to an exterior of the nonvolatile memory 730.

When it is determined according to the test result TEST_RESULT that the program mode does not operate normally, the nonvolatile memory 730 may completely deactivate the program mode such that the semiconductor memory device does not use the program mode any more.

The test control block 740 may correspond to the test control block 430 of the semiconductor device shown in FIG. 4. The test control block 740 receives at least one control signal, for example, corresponding to PWR1 to PWR3, OP_BU and OP_PGM as in FIG. 4, generated in the nonvolatile memory 730, and tests whether the nonvolatile memory 730 performs normally in the program mode. The test control block 740 may store the test result TEST_RESULT, and may output the stored value to the data output block 704 when the test result read command TEST_READ is activated.

The latch block 750 sequentially stores the repair data REPAIR_DATA transmitted from the nonvolatile memory 730, based on the clock CLK, in the boot-up operation. The latch block 750 may include the first latch unit 751 which corresponds to the first sub cell array 761, and the second latch unit 752 which corresponds to the second sub cell array 762. The first latch unit 751 may receive and store the data of the first storage space, and the second latch unit 752 may receive and store the data of the second storage space. When the nonvolatile memory 730 sequentially outputs the data of the first storage space and then sequentially outputs the data of the second storage space, the first latch unit 751 may store the repair data REPAIR_DATA while the data of the first storage space are outputted, and the second latch unit 752 may store the repair data REPAIR_DATA while the data of the second storage space are outputted.

Entire operations of the semiconductor device will be described below based on the foregoing.

When the boot-up operation is performed by the initialization of the semiconductor memory device, that is, during power-on from a power-off state or reset, the repair data REPAIR_DATA among the data stored in the nonvolatile memory 730 are transmitted to and stored in the latch block 750, and the data RESIDUE are transmitted to and stored in the mode registers 721. The data stored in the latch block 750 are used in replacing failed normal cells with redundancy cells in a normal access operation of the semiconductor memory device, that is, a read or write operation. The data stored in the mode registers 721 are outputted to an exterior of the semiconductor memory device when the mode register read command MRS_READ is activated.

When the program mode of the semiconductor device is activated, since the program operation is performed first, the nonvolatile memory 730 stores the input repair data IN_REPAIR_DATA. If the program operation is completed, since new repair data are stored in the nonvolatile memory 730, the boot-up operation is performed and uses the new repair data in the redundancy operation. The newly stored repair data REPAIR_DATA are stored in the latch block 750 through the boot-up operation.

When testing the program mode of the semiconductor memory device, although control signals in the nonvolatile memory 730 are activated in the same manner a in the program operation under a general program mode and the boot-up operation, data are not actually stored in the nonvolatile memory cells or the data stored in the nonvolatile memory 730 are not transmitted to the latch block 750. The test control block 740 tests whether the nonvolatile memory 730 operates normally in the program mode, by using control signals in the nonvolatile memory 730, and stores and outputs the test result TEST_RESULT. The test result TEST_RESULT is outputted to an exterior of the semiconductor memory device when the test result read command TEST_READ is activated.

The semiconductor memory device according to the embodiment of the present invention may easily test whether the nonvolatile memory 730 operates normally in the program mode. When performing the test, it may not be necessary to consume the storage space of the nonvolatile memory 730.

While it was described in FIG. 7 that the data RESIDUE and the test result TEST_RESULT are outputted through the data output block 704, it is to be noted that the data RESIDUE and the test result TEST_RESULT may be outputted using a separate output block.

Figure 8A:
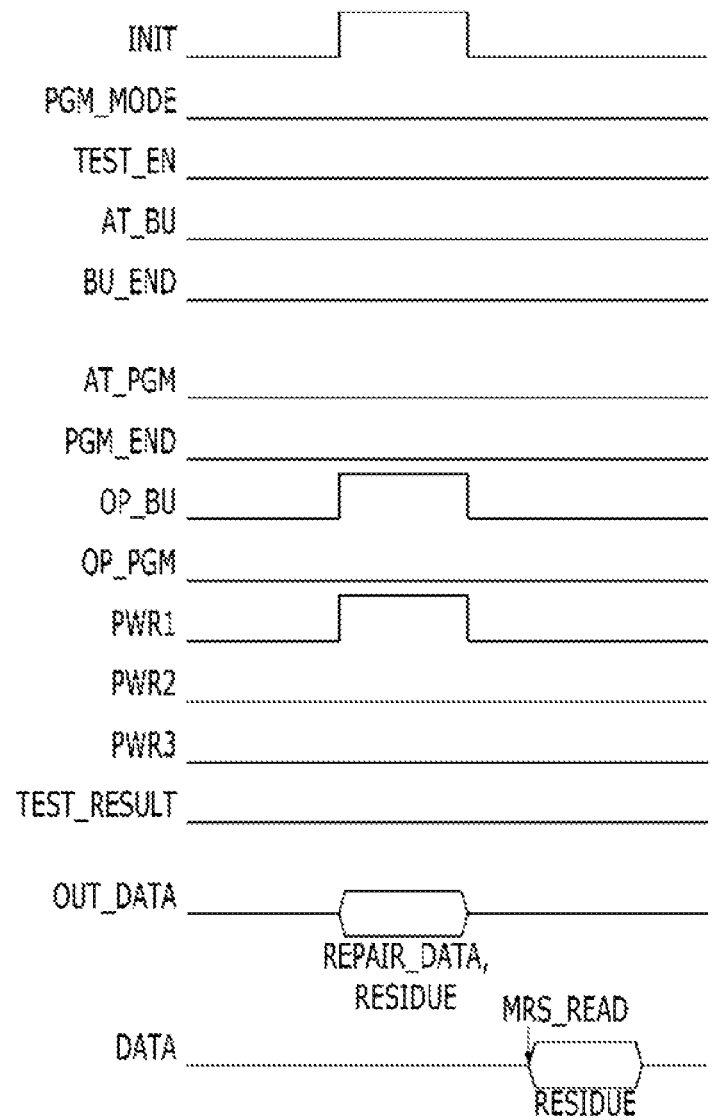
FIGS. 8A to 8C are waveform diagrams for describing operations of the semiconductor memory device shown in FIG. 7.
Figure 8B:
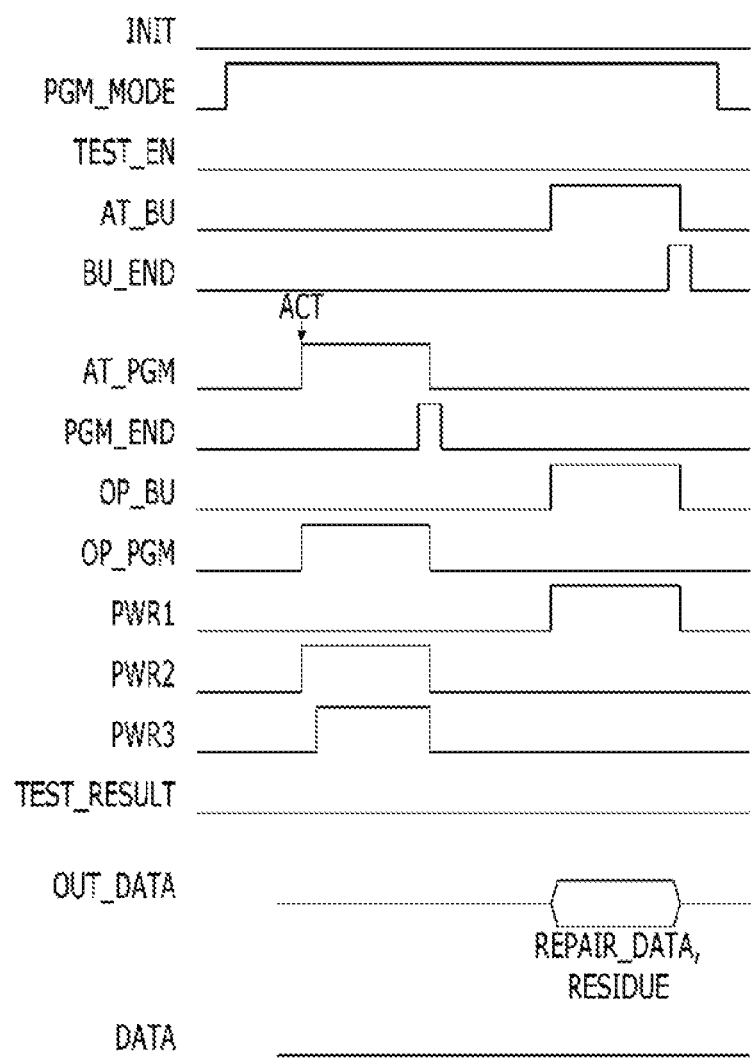
Figure 8C:
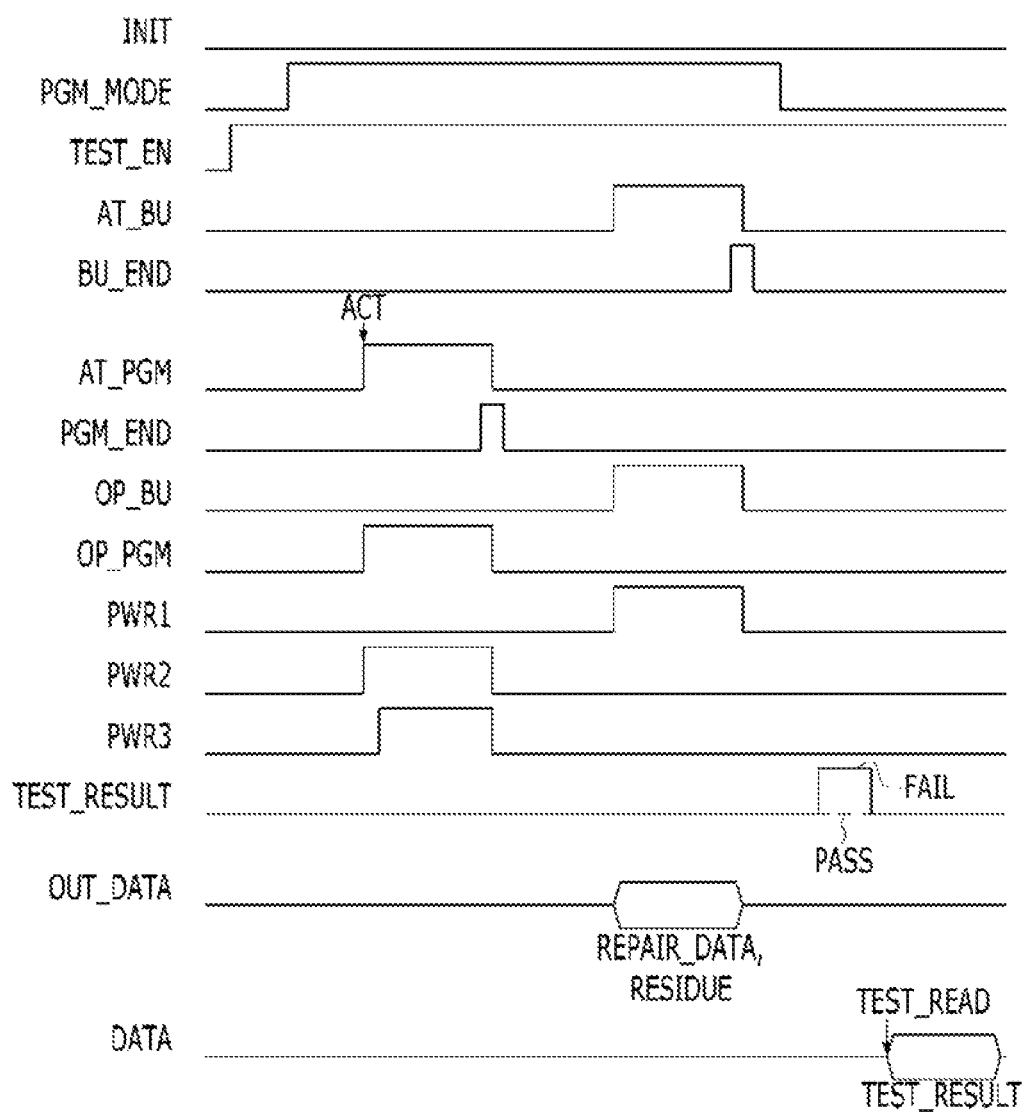

FIGS. 8A to 8C are waveform diagrams for describing operations of the semiconductor memory device shown in FIG. 7.

FIG. 8A is a waveform diagram describing the boot-up operation of the semiconductor memory device shown in FIG. 7.

During a period in which the initialization signal INIT is activated, the semiconductor memory device performs the boot-up operation. The first power signal PWR1 and the boot-up operation signal OP_BU are activated during the period in which the initialization signal INIT is activated, the repair data REPAIR_DATA are transmitted to the latch block 750 through the output data OUT_DATA, and the data RESIDUE are transmitted to the mode registers 721. If the mode register read command MRS_READ is activated, the data RESIDUE are outputted to an exterior of the semiconductor memory device through the data output block 704.

FIG. 8B is a waveform diagram describing the program mode of the semiconductor memory device shown in FIG. 7.

When the active command ACT is activated after the program mode signal PGM_MODE is activated in the operation on the program mode, the program signal AT_PGM is activated. If the program signal AT_PGM is activated, the program operation signal OP_PGM is activated for a predetermined period. During the period in which the program operation signal OP_PGM is activated, the first power signal PWR1 is activated, and when the program voltage V_PGM is stabilized, the second power signal PWR2 is activated. The input repair data IN_REPAIR_DATA are stored in the nonvolatile memory 730 through the program operation. If the program operation is completed, the program end signal PGM_END is activated, and after a predetermined time passes therefrom, the boot-up signal AT_BU is activated. If the boot-up signal AT_BU is activated, the first power signal PWR1 and the boot-up operation signal OP_BU are activated, the repair data REPAIR_DATA are transmitted to the latch block 750 through the output data OUT_DATA, and the data RESIDUE are transmitted to the mode registers 721.

FIG. 8C is a waveform diagram describing a test operation for the program mode of the semiconductor memory device shown in FIG. 7.

To test the program mode, a test mode is entered before the program mode is activated, and the test signal TEST_EN is activated. Subsequent operations are the same as in the program operation described above. However, the test result TEST_RESULT is deactivated or activated according to whether one or more control signals PWR1 to PWR3, OP_BU and OP_PGM are normally activated. The test result TEST_RESULT is outputted to an exterior of the semiconductor memory device through the data output block 704 when the test result read command TEST_READ is activated.

Figure 9:
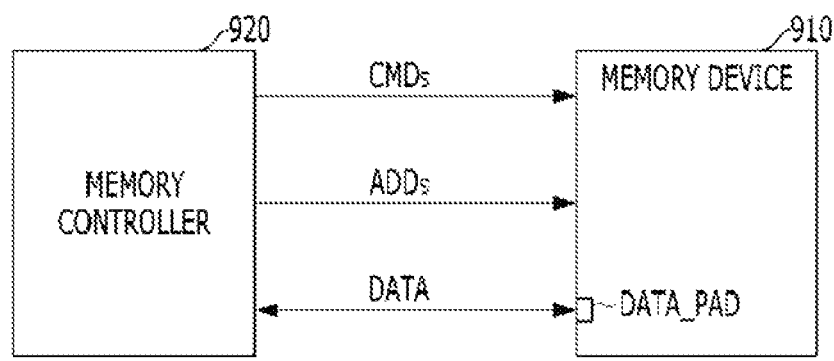
FIG. 9 is a block diagram illustrating a semiconductor system in accordance with an embodiment of the present inventions

FIG. 9 is a block diagram illustrating a semiconductor system in accordance with an embodiment of the present invention.

As shown in FIG. 9, the semiconductor system may include a memory device 910 and a memory controller 920. The memory device 910 may have the same configuration as the semiconductor memory device shown in FIG. 7.

The semiconductor system will be described below with reference to FIGS. 7 to 9.

The memory controller 920 controls operations of the memory device 910 by applying commands CMDs and addresses ADDs to the memory device 910, and exchanges data DATA with the memory device 910 in read and write operations.

The memory controller 920 sets the operation modes of the memory device 910 by transmitting the commands CMDs and addresses ADDs. According to a combination of the commands CMDs and the addresses ADDs, the memory device 910 may be set to at least one of a program mode and a test mode.

The memory controller 920 may receive the data RESIDUE, which are stored in the mode registers 721 of the memory device 910, by transmitting the commands CMDs when an operation mode of the memory device 910 may be set. The memory controller 920 may activate the program mode of the memory device 910, by transmitting the commands CMDs after the memory device 910 enters the program mode, and may store new repair data in the nonvolatile memory 730 of the memory device 910, by applying the addresses ADDs of failed memory cells.

Moreover, the memory controller 920 may test whether the nonvolatile memory 730 performs the program mode normally, by activating the program mode after the memory device 910 enters the test mode. Further, the memory controller 920 may receive the test result TEST_RESULT stored in the test control block 740, by transmitting the commands CMDs during the test mode. The memory device 910 may output the first data RESIDUE and the second data TEST_RESULT through a data input/output pad DATA_PAD, which exchanges data with the memory controller 920.

The memory controller 920 may store new repair data in the nonvolatile memory 730 through the program mode, when it is determined that an unused storage space exists in the nonvolatile memory 730 and the nonvolatile memory 730 operates normally in the program mode, based on the data RESIDUE and the test result TEST_RESULT. The memory controller 920 may not use the program mode, when an unused storage space does not exist in the nonvolatile memory 730 or the nonvolatile memory 730 does not operate normally in the program mode.

For reference, according to FIGS. 7 and 9, when the nonvolatile memory 730 does not operate normally in the program mode, the semiconductor memory device may completely deactivate the program mode by itself (see FIG. 7), or the program mode may be deactivated by causing the memory controller 920 not to use the program mode (see FIG. 9).

According to the embodiments of the present invention, it may be possible to test whether a circuit for storing repair data in a nonvolatile memory operates normally, without directly storing the repair data in the nonvolatile memory.

As a consequence, it may be possible to prevent a nonvolatile memory cell from being consumed for a test and to simply perform a test of a circuit for storing repair data in a nonvolatile memory.

Although various embodiments have been described for illustrative purposes, it will be apparent to those skilled in the art that various changes and modifications may be made without departing from the spirit and scope of the invention as defined in the following claims.

What is claimed:

1. A semiconductor device comprising:
   a nonvolatile memory block suitable for outputting data stored in a plurality of nonvolatile memory cells included therein based on first control information, and programming data in the nonvolatile memory cells based on second control information;
   a control block suitable for generating the first control information based on an initialization signal, wherein the control block sequentially generates the second control information and the first control information when a program mode is activated; and
   a test control block suitable for deactivating the nonvolatile memory block and determining whether at least one control signal among a plurality of control signals included in the first and second control information is normally generated, in a test operation on the program mode.

2. The semiconductor device according to claim 1, wherein, when the nonvolatile memory block is deactivated, the nonvolatile memory block does not output the data stored in the nonvolatile memory cells even when the first control information is inputted, and does not program the data in the nonvolatile memory cells even when the second control information is inputted.

3. The semiconductor device according to claim 1, wherein the test control block stores and outputs a result of the test operation on the program mode.

4. The semiconductor device according to claim 1, wherein the control block receives a result of test operation on the program mode from the test control block, and deactivates the program mode when the at least one control signal is not normally generated.

5. The semiconductor device according to claim 1, wherein the nonvolatile memory block comprises:
   a voltage generation unit suitable for generating a boot-up voltage based on a first power signal, and generating a program voltage having a voltage level higher than the boot-up voltage based on second and third power signals; and
   a cell array unit suitable for outputting the data stored in the nonvolatile memory cells, by using the boot-up voltage, while a boot-up operation signal is activated, and programming the data in the nonvolatile memory cells, by using the program voltage, while a program operation signal is activated.

6. The semiconductor device according to claim 1, wherein the control block comprises:
   a program mode control unit suitable for sequentially activating a program signal and a boot-up signal when the program mode is activated; and
   a control signal generation unit suitable for activating the boot-up operation signal based on the initialization signal or the boot-up signal, and activating the program operation signal based on the program signal.

7. The semiconductor device according to claim 6,
   wherein the first control information includes at least one signal among the first power signal, the boot-up signal and the boot-up operation signal, and
   wherein the second control information includes at least one signal among the second power signal, the third power signal, the program signal and the program operation signal.

8. The semiconductor device according to claim 7, wherein the test control block includes:
   a test determination unit suitable for, in the test operation on the program mode, receiving at least one signal among the first to third power signals, the boot-up signal, the boot-up operation signal, the program signal and the program operation signal, determining whether an inputted signal is activated normally, and outputting a determination result; and
   a test result storage unit suitable for storing the outputted determination result.

9. The semiconductor device according to claim 8, wherein the program mode control unit is deactivated when the at least one signal inputted to the test determination unit is not activated normally, based on the determination result of the test determination unit.

10. The semiconductor device according to claim 8, wherein, in the test operation on the program mode, the test determination unit latches a logic value of the inputted signal when the program mode is activated, and generates the determination result by combining a latched value.

11. The semiconductor device according to claim 1, wherein the nonvolatile memory cells include one-time program cells, each of which is capable of changing logic values of data stored therein once.

12. A semiconductor memory device comprising:
    a nonvolatile memory suitable for storing repair data, transmitting the stored repair data in an initializing operation, wherein, when a program mode is activated, the nonvolatile memory stores inputted repair data by using control information generated therein and transmits the stored repair data;
    a test control block suitable for controlling the nonvolatile memory, and determining whether the control information is normally generated, in a test operation on the program mode, wherein the nonvolatile memory generates the control information but does not perform operations of storing and transmitting the repair data;
    a latch block suitable for storing data transmitted from the nonvolatile memory, when the initializing operation is performed or when the program mode is activated; and
    a memory cell array in which normal cells are replaced with redundancy cells by using the data stored in the latch block.

13. The semiconductor memory device according to claim 12, wherein the nonvolatile memory outputs whether or not an unused storage space exists in the initializing operation.

14. The semiconductor memory device according to claim 13, wherein the test control block stores and outputs a result of determining whether the control information is normally generated.

15. The semiconductor memory device according to claim 13, wherein the test control block deactivates the nonvolatile memory such that the nonvolatile memory does not activate the program mode when the control information is not normally generated.

16. The semiconductor memory device according to claim 13, wherein, during the initializing operation when the memory cell array includes a plurality of sub cell arrays, the nonvolatile memory includes a plurality of storage spaces corresponding to the respective sub cell arrays, and outputs whether an unused storage space exists in the respective storages spaces.

17. The semiconductor memory device according to claim 13, wherein information regarding existence of unused storage space in the nonvolatile memory and a determination result of the test control block are outputted to an exterior of the semiconductor memory device.

18. A memory system comprising:
a memory device including a nonvolatile memory and a memory cell array, which performs a redundancy operation for replacing normal cells therein with redundancy cells therein, by using repair data stored in the nonvolatile memory, wherein the memory device outputs first data indicating whether an unused storage space exists in the nonvolatile memory during an initializing operation, stores inputted repair data in the nonvolatile memory when a program mode is activated, and outputs second data indicating whether an internal control signal generated for performing the program mode is normally generated in a test operation on the program mode; and
a memory controller, suitable for storing, based on the first data and the second data outputted from the memory device, new repair data in the nonvolatile memory through the program mode when an unused storage space exists in the nonvolatile memory, wherein the memory controller deactivates the program mode when an unused storage space does not exist in the nonvolatile memory or when the internal control signal is not normally generally.

19. The memory system according to claim 18, wherein the memory controller controls the program mode of the memory device, by transmitting a plurality of command signals and addresses to the memory device.

20. The memory system according to claim 18, wherein the memory device outputs the first data and the second data through a data input/output pad.

* * * * *